United States Patent
Ota et al.

(10) Patent No.: US 9,825,096 B2
(45) Date of Patent: Nov. 21, 2017

(54) RESISTANCE CHANGE MEMORY, METHOD OF MANUFACTURING RESISTANCE CHANGE MEMORY, AND FET

(71) Applicant: TOSHIBA MEMORY CORPORATION, Minato-ku (JP)

(72) Inventors: Kensuke Ota, Kawasaki (JP); Masumi Saitoh, Yokkaichi (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days.

(21) Appl. No.: 14/747,215

(22) Filed: Jun. 23, 2015

(65) Prior Publication Data

US 2016/0079309 A1   Mar. 17, 2016

(30) Foreign Application Priority Data

Sep. 17, 2014   (JP) .................................. 2014-188706

(51) Int. Cl.
  *H01L 27/24*   (2006.01)
  *H01L 45/00*   (2006.01)

(52) U.S. Cl.
  CPC ........ *H01L 27/2454* (2013.01); *H01L 27/249* (2013.01); *H01L 45/04* (2013.01); *H01L 45/1226* (2013.01)

(58) Field of Classification Search
  None
  See application file for complete search history.

(56) References Cited

U.S. PATENT DOCUMENTS

| | | | |
|---|---|---|---|
| 2005/0285150 A1* | 12/2005 | Birner | H01L 21/76224 257/213 |
| 2007/0018251 A1 | 1/2007 | Hirase et al. | |
| 2012/0001300 A1* | 1/2012 | Ito | H01L 21/02532 257/607 |
| 2013/0339571 A1 | 12/2013 | Cernea et al. | |
| 2015/0249112 A1* | 9/2015 | Takeguchi | H01L 27/2454 257/314 |
| 2015/0263091 A1* | 9/2015 | Hashemi | H01L 29/1008 257/191 |

FOREIGN PATENT DOCUMENTS

| | | |
|---|---|---|
| JP | 2007-53336 | 3/2007 |
| JP | 2008-53638 | 3/2008 |
| JP | 4486056 | 6/2010 |

* cited by examiner

*Primary Examiner* — Ori Nadav
*Assistant Examiner* — Ernest Allen, III
(74) *Attorney, Agent, or Firm* — Oblon, McClelland, Maier & Neustadt, L.L.P.

(57) ABSTRACT

According to one embodiment, a resistance change memory includes a first conductive line, a second conductive line provided above the first conductive line, and extending in a first direction, a third conductive line extending in a second direction intersecting the first direction, a select transistor provided between the first and third conductive lines, and a resistance change layer provided between the second and third conductive lines.

8 Claims, 12 Drawing Sheets

Image diagram of crystal orientations of crystal grains in channel area 6

Comparative example

Arrow : <100>-direction

Second direction
(Direction in which current flows)

Embodiment

Arrow : <100>-direction

Second direction
(Direction in which current flows)

FIG. 15 ing in a second direction intersecting the first direction; a select transistor provided between the first and third conductive lines; and a resistance change layer provided between the second and third conductive lines. The select transistor includes: a first conductive layer provided on the first conductive line; a first semiconductor layer as a channel including crystal grains, the first semiconductor layer being provided on the first conductive layer; a second conductive layer provided on the first semiconductor layer, and connected to the third conductive line; and a fourth conductive line as a gate extending in the first direction, the fourth conductive line facing to the first semiconductor layer and being provided between the first and second conductive lines. The first conductive layer and the first semiconductor layer include a predetermined impurity with a first impurity concentration and the second conductive layer includes no predetermined impurity or the predetermined impurity with a second impurity concentration less than the first impurity concentration.

An embodiment will be described with reference to the accompanying drawings.

RESISTANCE CHANGE MEMORY, METHOD OF MANUFACTURING RESISTANCE CHANGE MEMORY, AND FET

CROSS-REFERENCE TO RELATED APPLICATIONS

This application is based upon and claims the benefit of priority from Japanese Patent Application No. 2014-188706, filed Sep. 17, 2014, the entire contents of which are incorporated herein by reference.

FIELD

Embodiments described herein relate generally to a resistance change memory, a method of manufacturing the resistance change memory, and an FET.

BACKGROUND

In recent years, small portable devices have been spread worldwide, and at the same time, there has been a great and rapid demand for high-speed and large-capacity nonvolatile memories in accordance with the significant development in high-speed information transmission networks. For instance, NAND flash memories have rapidly evolved in recording capacity and have constituted a large market as storage memories. However, the NAND flash memories are significantly lower in operating speed than volatile memories, such as DRAMs or SRAMs.

In view of the above, attention has been paid to a resistance change memory (ReRAM) as a nonvolatile RAM that has substantially the same operation speed as the nonvolatile memories. The resistance change memory can be made to have a large capacity, using a three-dimensional array, and can store data in a nonvolatile manner. Therefore, it offers promising prospects when it is used as a work memory for, in particular, a system, such as a small portable device, for which low energy consumption is required. However, to exploit this feature, it is necessary to contrive the array and/or transistor structure.

DETAILED DESCRIPTION

Figure 1:
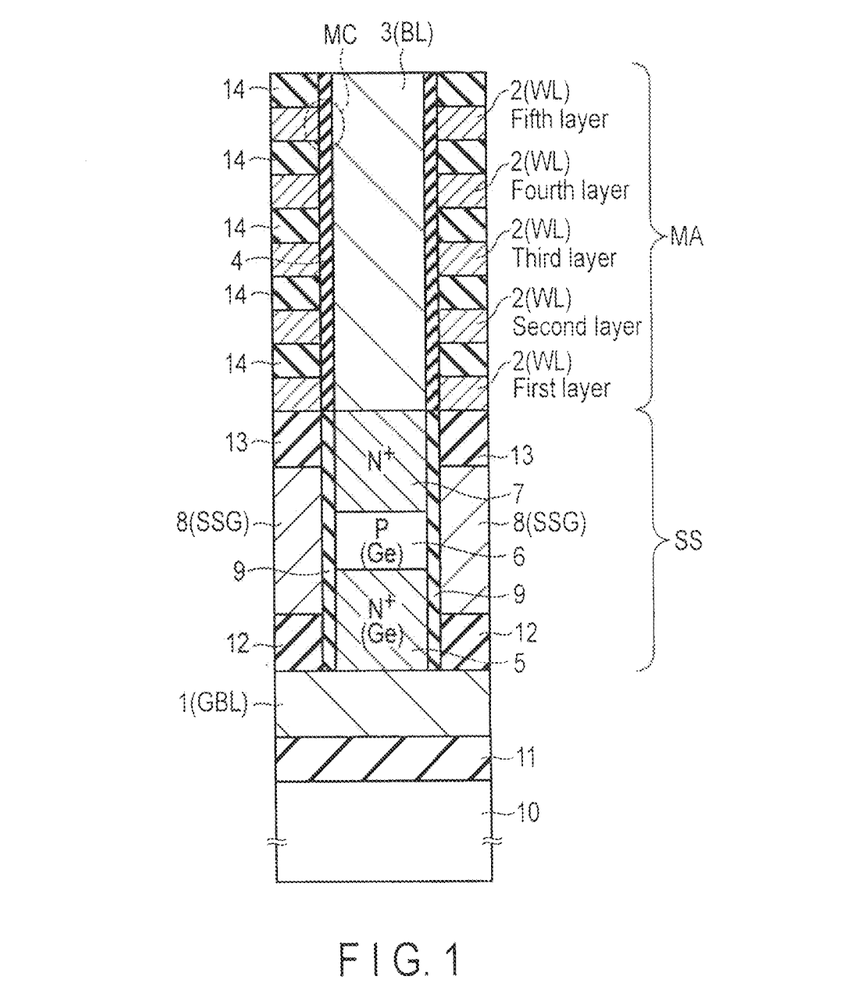
FIG. 1 is a cross-sectional view showing a memory cell array structure.

In general, according to one embodiment, a resistance change memory comprises: a first conductive line; a second conductive line provided above the first conductive line, and extending in a first direction; a third conductive line extend- 1. Memory Cell Array Structure FIG. 1 shows an example of a memory cell array structure.

A memory cell array MA and a select transistor SS are provided on an interlayer insulating layer (for example, a silicon oxide layer) 11 on a semiconductor substrate (for example, a single-crystal silicon layer) 10.

A global bit line (GBL) 1 is provided on, for example, the interlayer insulating layer 11, and extends parallel to the upper surface of the semiconductor substrate 10. The select transistor SS is, for example, a field-effect transistor (FET).

The select transistor SS comprises a source region 5 on the global bit line 1, a channel region 6 on the source region 5, and a drain region 7 on the channel region 6. The select transistor SS further comprises two select gate lines (select gate electrodes) 8 (SSG) separate from each other. The two select gate lines 8 extend parallel to each other, for example.

Gate insulating layers 9 are interposed between the two select gate lines 8 and the channel region 6. Interlayer insulating layers 12 and 13 isolate the two select gate lines 8 from each other.

The channel region 6 is a semiconductor layer (for example, a polysilicon layer) including crystal grains. The source region 5 and the drain region 7 are desirably semiconductor layers (for example, polysilicon layers), but may be conductive layers formed of, for example, a metal.

If, for instance, the select transistor SS is an N-channel FET and the source, channel and drain regions 5, 6 and 7 are semiconductor layers, the source and drain regions 5 and 7 contain an N-type impurity (for example, As, P, etc.), and the channel region 6 contains a P-type impurity (for example, B), as is shown in FIG. 1.

In contrast, if the select transistor SS is a P-channel FET and the source, channel and drain regions 5, 6 and 7 are semiconductor layers, the source and drain regions 5 and 7 contain the P-type impurity (for example, B), and the channel region 6 contains the N-type impurity (for example, P, As, etc.), In the embodiment, the source and channel regions 5 and 6 contain a predetermined impurity (for example, Ge, Ar, F, C, etc.), and the drain region does not contain the predetermined impurity. The drain region may contain the predetermined impurity with an impurity concentration less than an impurity concentration of the predetermined impurity in the source and channel regions 5 and 6. This is because the predetermined impurity is used to control the crystalline orientation of the channel region 6 of the select transistor SS.

This will be described in more detail.

It is desirable that the select transistor SS should have as much on-current as possible and least variation in the on-current in set/reset, read, forming, etc., operations in order to pass a predetermined current therethrough. To this end, it is effective to enhance the mobility (i.e., electron-mobility/hole-mobility) of the channel 6 of the select transistor SS.

As a technique for enhancing the mobility in the channel region of an FET, a technique is known in which crystal strain is applied to the channel region, more specifically, tensile strain and compression strain are applied along the channel length and width, respectively, in the N-channel FET, and compression strain and tensile strain are applied along the channel length and width, respectively, in the P-channel FET. In this technique, however, the channel region is assumed to have a single-crystal structure. If the channel region is formed of a semiconductor layer including crystal grains, such as a polysilicon layer, the mobility of the FET channel region cannot sufficiently be enhanced even if crystal strain is applied thereto, because the crystal grains in the semiconductor layer have random orientations.

To enhance the mobility of the channel region 6 of the select transistor SS utilizing crystal strain, it is important to set, to a predetermined orientation, the different orientations of the grains in the channel region 6 of a polycrystal structure, before applying crystal strain to the channel region 6.

To this end, the above-mentioned predetermined impurity is implanted into the source and channel regions 5 and 6. The reason why the predetermined impurity is also implanted into the source region 5 is that the embodiment is directed to a vertical-type FET. The vertical-type FET means an FET for passing a current in a direction vertical to the upper surface of the semiconductor substrate 10 (hereinafter referred to as the vertical direction).

Namely, in the vertical-type FET, the predetermined impurity is implanted into the channel 6 after the source and channel regions 5 and 6 are stacked. At this time, the predetermined impurity may be implanted into the source region 5. In view of the purpose of enhancing the mobility of the channel region 6, the predetermined impurity does not have to be implanted into the source region 5. Further, the drain region 7 does not include the predetermined impurity since it is formed after the impurity implantation.

When the predetermined impurity is implanted into the channel region 6 of the select transistor SS and the resultant structure is subjected to annealing as will be described later, the number of crystal grains whose vertical orientation is <100>-orientation, or the number of crystal grains whose plane parallel to the upper surface of the semiconductor substrate 10 (hereinafter referred to as the parallel plane) is {001}-plane, is increased among the crystal grains of the channel region 6, compared to that assumed before the annealing.

Figure 2:
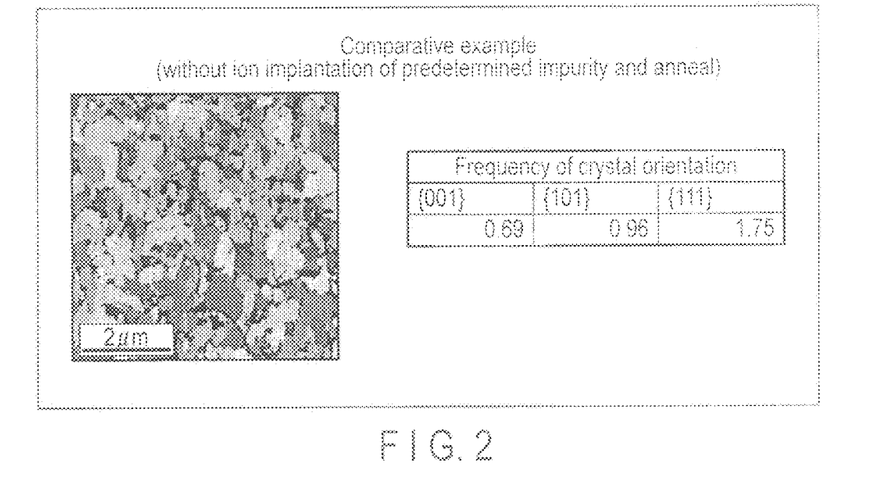
FIG. 2 shows a comparative example in which crystal grains have different orientations.
Figure 3:
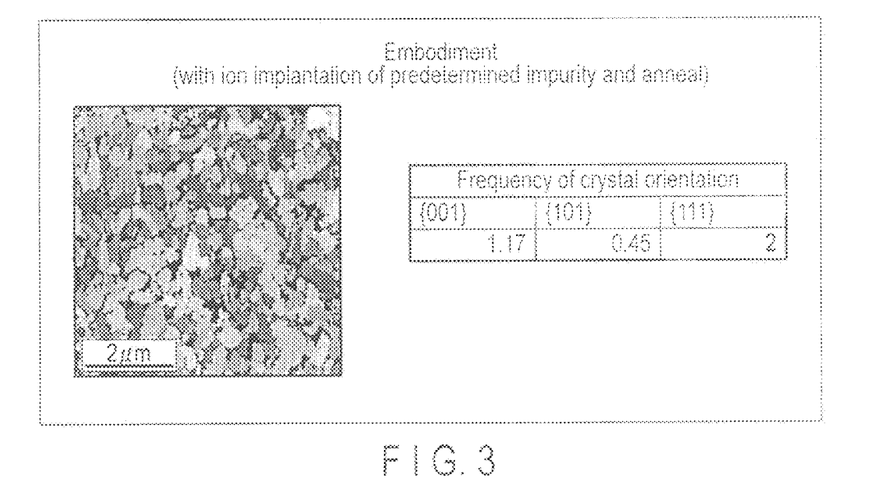
FIG. 3 shows an embodiment in which crystal grains have different orientations.

According to crystal orientation analysis (experimental data) by electron beam backscatter diffraction, the number (frequency: 0.69) of crystal grains whose parallel plane is {001}-plane is smaller than the number (frequency: 0.96) of crystal grains whose parallel plane is {101}-plane when the predetermined impurity is not implanted as shown in FIG. 2. In contrast, as shown in FIG. 3, when the implantation of the predetermined impurity and the annealing have been executed, the number (frequency: 1.17) of crystal grains whose parallel plane is {001}-plane is greater than the number (frequency: 0.45) of crystal grains whose parallel plane is {101}-plane.

Figure 4:
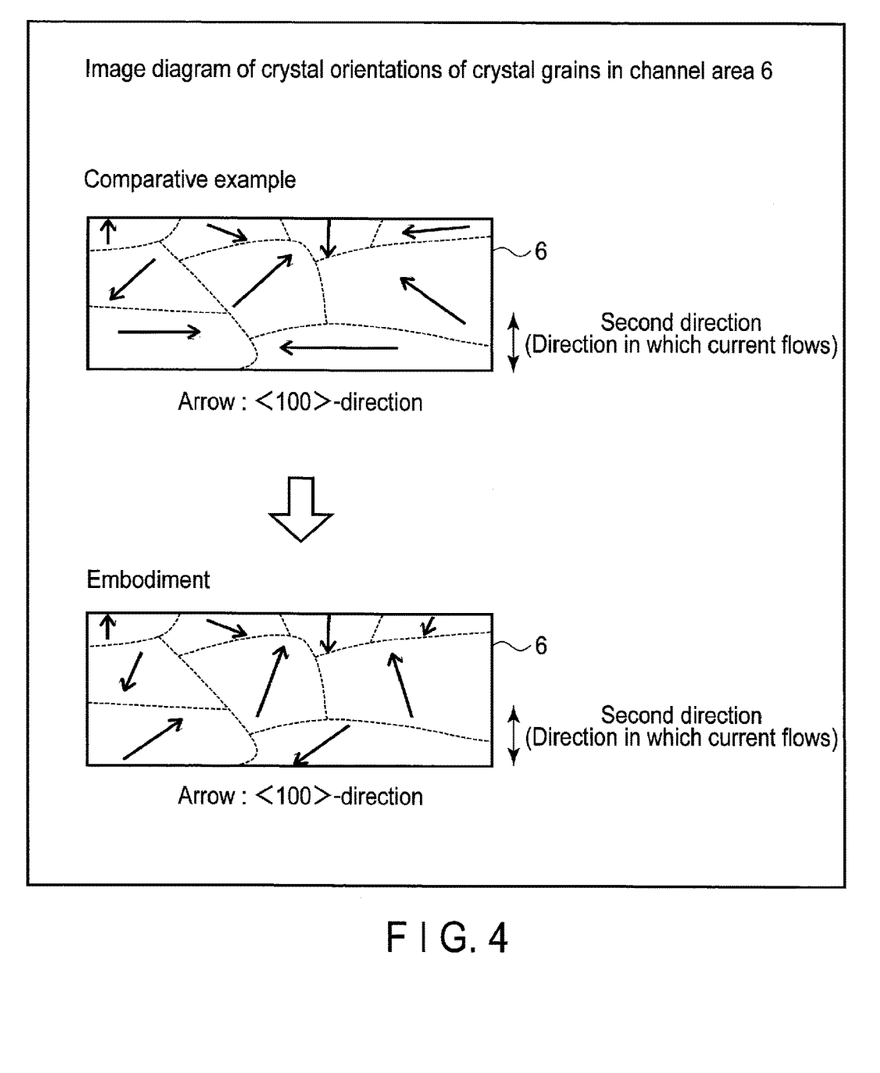
FIG. 4 is a view for explaining the control of the orientations of crystal grains.

As described above, in the embodiment, by implanting the predetermined impurity into the channel region 6 and then subjecting the resultant structure to annealing, the vertical crystal orientation of the crystal grains in the channel region 6 can be adjusted to <100>-orientation as shown in, for example, FIG. 4. In other words, the fact that the parallel plane of the crystal grains in the channel region 6 can be set to {001}-plane has been found.

Thus, in the channel region 6 of the polycrystal structure in the select transistor (vertical-type FET) SS, if crystal strain is applied to the channel region 6 after such crystal orientation control is performed, the mobility of the channel region 6 can be enhanced by the strain effect.

Further, for example, the mobility of the channel region 6 obtained when the channel region 6 is formed of a polysilicon layer can be made to approach the mobility of the channel region 6 obtained when the channel region 6 is formed of a single-crystal silicon layer.

Refer back to the memory cell array structure.

The memory cell array MZ is provided on the select transistor SS.

Word lines (WL) 2 are stacked vertically such that, for example, they extend parallel to each other. The word lines 2 are isolated from each other by interlayer insulating layers 14. It is desirable that the word lines 2 and two select gate lines 8 should extend along the same axis.

Although in the embodiment, the word lines 2 are arranged in five layers, the embodiment is not limited to this. For instance, the word lines 2 may be provided in two or more layers.

A local bit line 3 (BL) vertically extends. An end (lower end) of the local bit line 3 is connected to the global bit line 1 via the select transistor SS, and the other end (upper end) of the local bit line 3 is open.

Memory cells MC each comprise a resistance change layer 4 and are interposed between the respective word lines 2 and the local bit line 3. In the embodiment, the resistance change layers 4 are provided on the periphery of the local bit line 3. However, only the portions of the layers 4 between the word lines 2 and the local bit line 3 function as the memory cells MC. The resistance change layer 4 may be provided on parts of the side surfaces of the local bit line 3.

Figure 5:
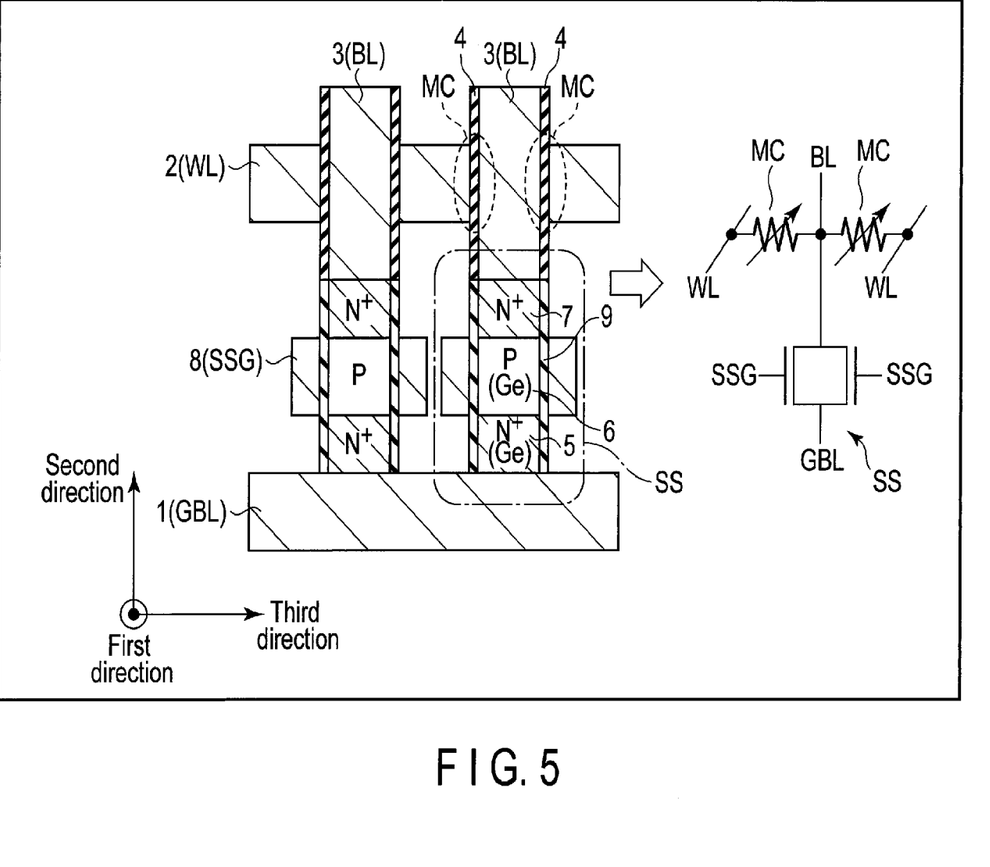
FIG. 5 is a partial sectional view of a memory cell array.

FIG. 5 shows partial cross sections of the memory cell array and the select transistor, and an example of its equivalent circuit.

The source region 5, the channel region 6 and the drain region 7 are sequentially stacked on the global bit line 1 (GBL). The gate insulating layers 9 are formed on the side surfaces of the resultant stacked structure.

The local bit line 3 comprises, for example, a conductive pillar (formed of, for example, a metal layer). The resistance change layers 4 functioning as the memory cells MC are provided on the side surfaces of the local bit line 3.

Although in the embodiment, each resistance change layer 4 is drawn as a single layer, it may be formed of multiple layers.

The resistance change layer 4 is formed of a material that transitions between at least two resistance states, i.e., a low-resistance state (LRS) and a high-resistance state (HRS). For instance, when a voltage higher than a threshold voltage is applied, the resistance change layer 4 transitions from the high-resistance state to the low-resistance state. Further, when a current greater than a threshold current flows, the resistance change layer 4 transitions from the low-resistance state to the high-resistance state.

In particular, an element, which performs transition from the high-resistance state to the low resistance state and transition from the low resistance state to the high-resistance state when voltages of different polarities are applied, is called a bipolar operation element.

The resistance change layer 4 can be made to be a multi-value element by making it have three or more resistance values.

By arranging, in, for example, a three-dimensional matrix, the memory cells MC including the resistance change layers 4 interposed between the word lines 2 (WL) and the local bit line 3, a memory cell array is formed.

In the above-described structure, the word lines 2 and the local bit line 3 are formed in a simple line & space pattern. Namely, it is sufficient if the word lines 2 and the local bit line 3 are laid out to assume a crossing positional relationship (cross-point type). This enables the positioning accuracy of the word lines 2 and the local bit line 3 to be set extremely low, with the result that the memory can be manufactured easily.

2. Entire Structure of Resistance Change Memory

Figure 6:
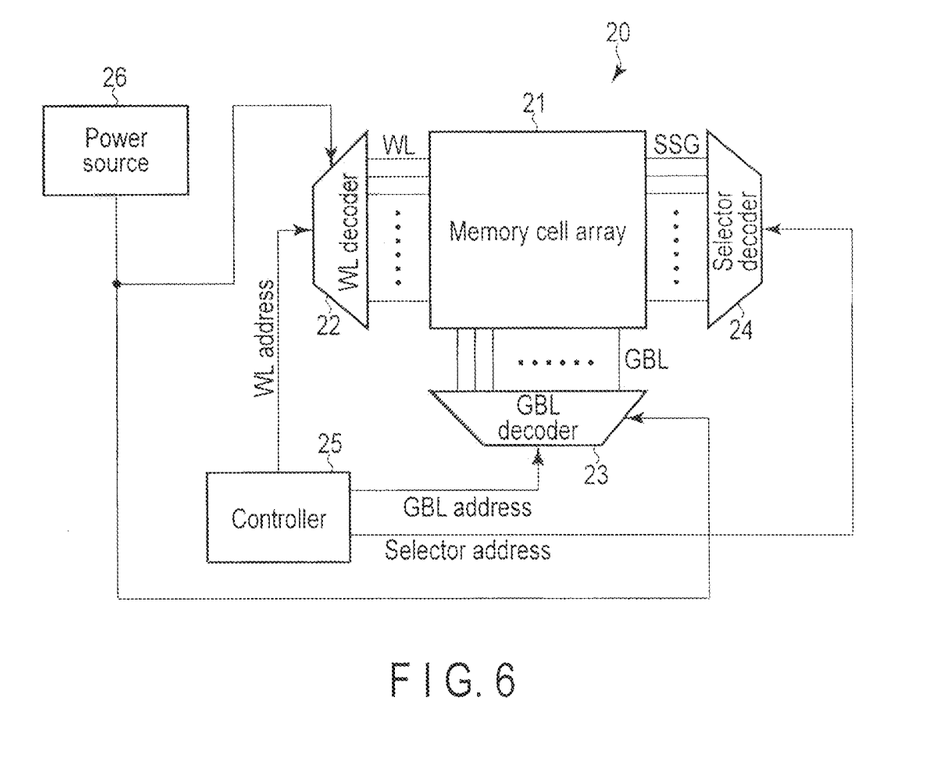
FIG. 6 is a block diagram showing a resistance change memory.

FIG. 6 is a block diagram showing an example of the entire structure of the resistance change memory.

As shown, a resistance change memory 20 comprises a memory cell array 21, a WL decoder 22, a GBL decoder 23, a selector decoder 24, a controller 25 and a power source 26.

The WL decoder 22 includes a selector configured to select one of the word lines WL, and a driver configured to drive the selected word line WL. The selector selects one of the word lines WL based on a WL address sent from the controller 25. The driver applies respective predetermined voltages to the selected word line WL and the other non-selected word lines WL in accordance with read, write and erase modes, etc.

The GBL decoder 23 includes a selector configured to select one of global bit lines GBL, and a driver configured to drive the selected bit line GBL. The selector selects one of the global bit lines GBL based on a GBL address sent from the controller 25. The driver applies respective predetermined voltages to the selected bit line GBL and the other non-selected bit lines GBL in accordance with read, write and erase modes, etc.

The selector decoder 24 includes a selector configured to select one of select transistors (selectors) SS, and a driver configured to drive the gate electrode (select gate line SSG) of the selected select transistor SS. The selector selects one of the select transistors SS based on a selector address sent from the controller 25. The driver applies respective predetermined voltages to the gate electrode (select gate line SSG) of the selected select transistor SS and the gate electrodes of the other non-selected select transistors SS in accordance with read, write and erase modes, etc.

The controller 25 controls the entire operation of the resistance change memory 20. Further, the controller 25 sends a WL address, a GBL address and a selector address to the WL decoder 22, the GBL decoder 23 and the selector decoder 24, respectively.

Also, during a write, the controller 25 controls the WL decoder 22, the GBL decoder 23 and the selector decoder 24 to make them apply necessary voltages to the corresponding word line WL, global bit line GBL and select gate line SSG, respectively, in order to change the resistance of the resistance change element of a selected memory cell MC.

More specifically, the controller 25 causes a current to flow between, for example, the word lines 2 (WL) and the local bit line 3 (BL) of FIG. 1 to vary the resistance value of the resistance change layers 4 of FIG. 1.

During a read, the controller 25 controls the WL decoder 22, the GBL decoder 23 and the selector decoder 24 to make them apply necessary voltages to the corresponding word line WL, global bit line GBL and select gate line SSG, respectively, in order to detect the resistance of the resistance change element of a selected memory cell MC as the storage state of the memory cell MC.

The controller 25 further comprises a sense amplifier, and can sense (amplify) data read to a global bit line GBL, using the sense amplifier.

The power source 26 is used to generate predetermined voltages needed for data reading, writing and erasure. The voltages generated by the power source 26 are applied to the word lines WL and the bit lines BL.

For instance, during a write, a large potential difference is applied between a selected word line WL and a selected bit line BL, thereby transitioning the resistance state of the corresponding resistance change element. Further, during data reading, a potential difference is applied between a selected word line WL and a selected bit line BL within a range in which no resistance state transition occurs, thereby detecting a current flowing through the bit line BL or the word line WL.

Figure 7:
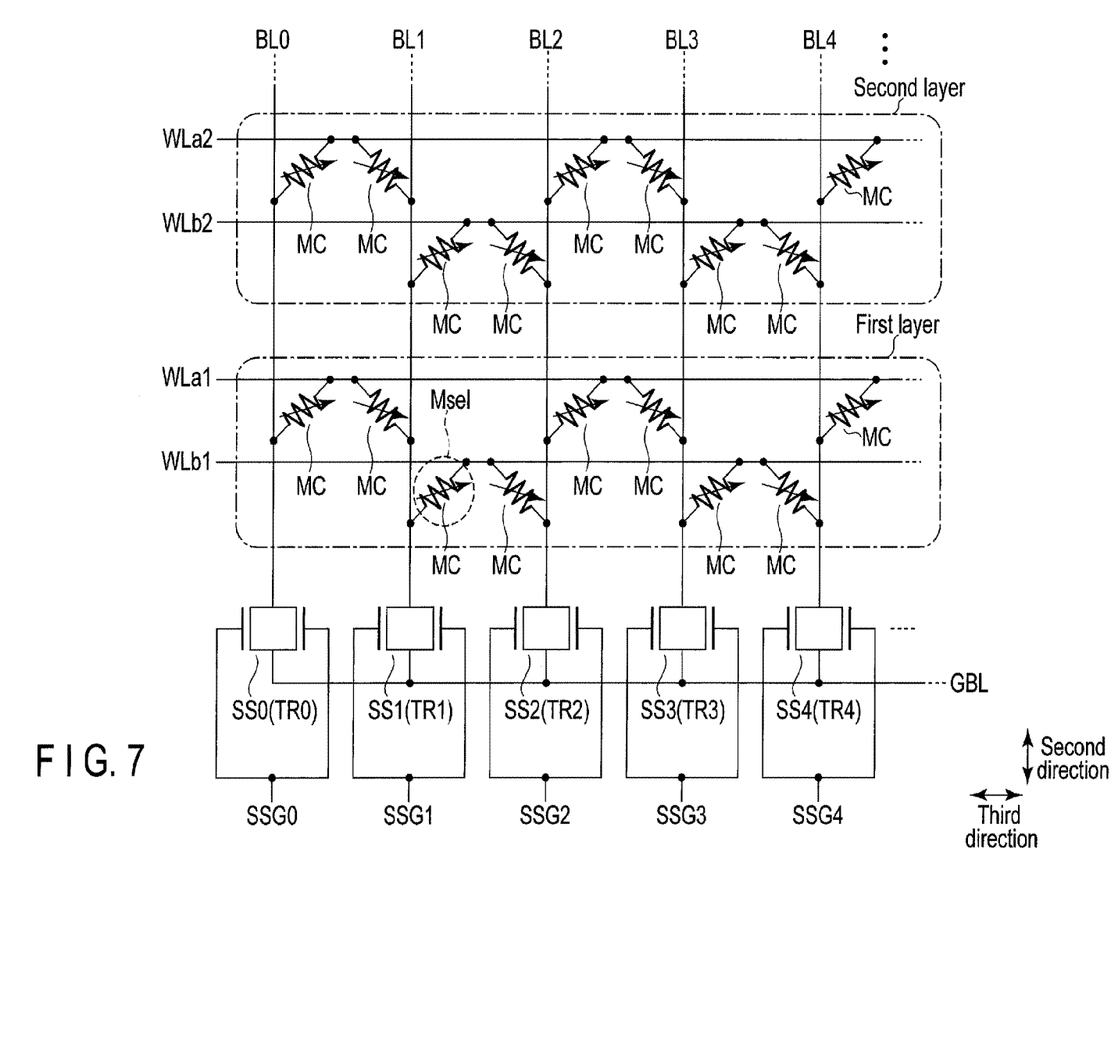
FIG. 7 is a circuit diagram showing a memory cell array.

FIG. 7 shows a circuit example of the memory cell array.

WLa1 and WLb1 indicate word lines formed in a first layer incorporated in the structure of FIG. 1, and WLa2 and WLb2 indicate word lines formed in a second layer incorporated in the structure of FIG. 1.

For instance, when SS1 and WLb1 are selected, SSG1 is made high ("H") to thereby make SS1 (TR1) conduct and transfer the potential of GBL to BL1. As a result, a potential difference occurs between WLb1 and BL1, thereby executing a predetermined operation, such as writing, on a selected cell Msel.

In the embodiment, a select transistor SSk (k= 0, 1, 2, . . . ) is connected between a single global bit line GBL and a single bit line BLj. The gate electrode of the select transistor SSk is connected to a select gate line SSGk.

Figure 8:
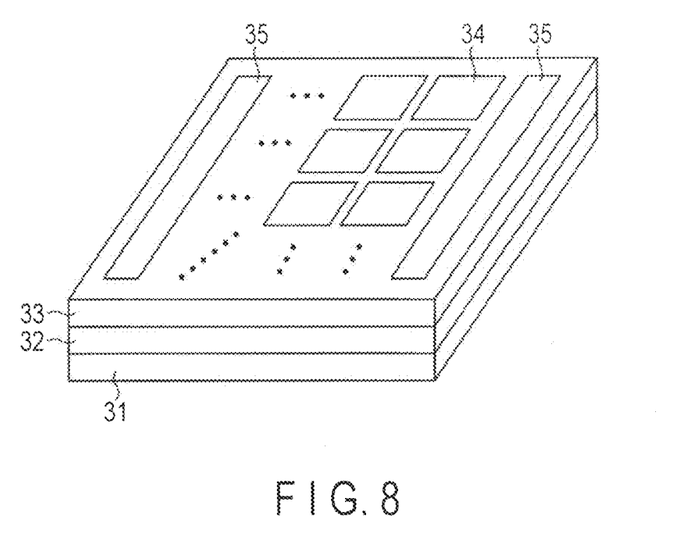
FIG. 8 is a perspective view showing the whole resistance change memory.

FIG. 8 shows an example of the resistance change memory.

A first layer 32 including a CMOS circuit is formed on a semiconductor substrate (for example, a silicon substrate) 31. On the first layer 32, a second layer 33 comprising blocks 34 including a memory cell array section and input/output sections 35 is formed. Each block 34 includes, for example, the structure of FIG. 1.

A memory cell array in each block 34 is formed by, for example, a design rule of 20 nm. Further, a portion called a peripheral circuit and including the decoders 22 to 24 and the controller 25 shown in FIG. 6 is formed in the first layer (CMOS circuit) 32.

The CMOS circuit in the first layer 32 is formed by a design rule of, for example, 100 nm, less strict than the deign rule of the memory cell array, except for the connections to the blocks (memory arrays) 34, the input/output section 35, etc., in the second layer 33. The electrical connection between the CMOS circuit in the first layer 32 and the blocks 34 or the input/output section 35 in the second layer 33 is achieved via through holes.

By thus achieving electrical connection between the CMOS circuit in the first layer 32 and the blocks 34 or the input/output section 35 in the second layer 33 via through holes, reduction of the operating time for writing, reading and erasing, and increase of the number of readable/writable memories can be simultaneously realized without increasing the chip area.

3. Manufacturing Method

A description will now be given of a method for manufacturing the resistance change memory of the embodiment.

FIGS. 9 to 15 show the steps of the method for manufacturing the resistance change memory.

Figure 9:
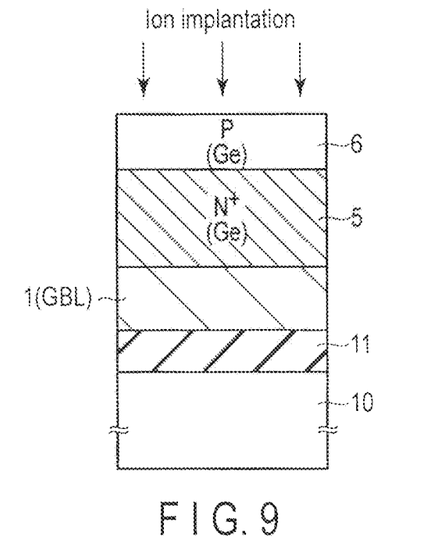
FIGS. 9 to 15 are cross-sectional views showing a method of manufacturing the resistance change memory.

Firstly, as shown in FIG. 9, a CMOS circuit for controlling the operation of a resistance change memory according to the above-described embodiment, for example, a ReRAM, is formed on a semiconductor substrate (for example, a silicon substrate) 10. Subsequently, an interlayer insulating layer 11 is formed on the semiconductor substrate 10 to cover the CMOS circuit.

Further, a global bit line 1 (GBL) is formed on the interlayer insulating layer 11. It is desirable that the line width of the global bit line 1 should be, for example, approximately 20 nm, the thickness should be, for example, approximately 150 nm, and the sheet resistance be, for example, approximately 1.5Ω.

The global bit line 1 comprises a laminated structure of, for example, tungsten (W) and titanium nitride (TiN) as a barrier metal.

Subsequently, a source region (for example, a silicon layer) 5 of a first conductivity type (for example, N type), and a channel region (for example, a silicon layer) 6 of a second conductivity type (for example, P type) are sequentially formed on the global bit line 1. The source and channel regions 5 and 6 have a polycrystalline structure (for example, a polysilicon layer) containing crystal grains.

A predetermined impurity (for example, Ge, Ar, F or C) is implanted into the channel region 6 from above by ion implantation. At this time, the predetermined impurity may also be implanted into the source region 5.

After that, annealing is performed on the source and channel regions 5 and 6 for recrystallization. As a result, among the crystal grains in the source and channel regions 5 and 6, the number of crystal grains whose vertical orientation is <100>-orientation, or the number of crystal grains whose parallel plane is {001}-plane, is increased.

Figure 10:
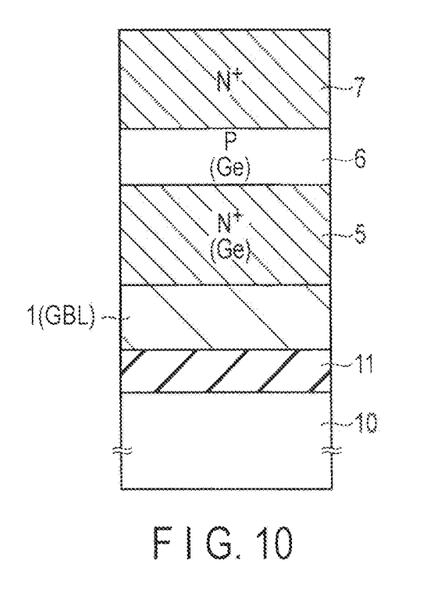

Thereafter, as shown in FIG. 10, a drain region (for example, a silicon layer) 7 having the first conductivity type (for example, N type) is formed on the channel region 6. The drain region 7 has a polycrystalline structure (for example, a polysilicon layer) containing crystal grains.

It is desirable that the source and drain regions 5 and 7 should have an N-type impurity with a concentration of, for example, approximately $1\times10^{20}$ $cm^{-3}$, and should have a thickness of, for example, approximately 40 nm. Further, it is desirable that the channel region 6 should have a P-type impurity with a concentration of, for example, approximately $1\times10^{18}$ $cm^{-3}$, and should have a thickness of, for example, approximately 120 nm.

Further, it is desirable that the predetermined impurity should be implanted into the source and channel regions 5 and 6 with a dose of $2\times10^{15}$ $cm^{-2}$ by acceleration energy 60 keV. It is also desirable that the annealing for recrystallization of the source and channel regions 5 and 6 should be performed at a temperature of approximately 700° C. for two hours, for example.

The source, channel and drain regions 5, 6 and 7 can be recrystallized by one annealing step.

Figure 11:
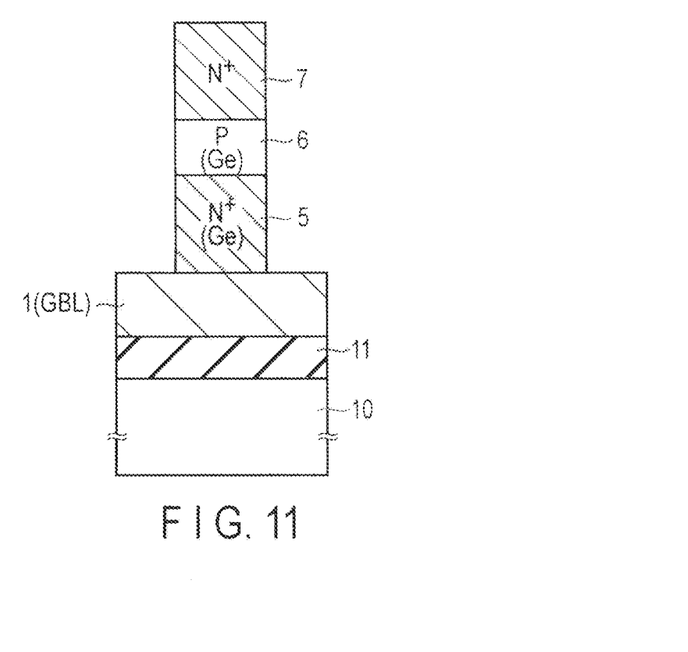

After that, as shown in FIG. 11, the source, channel and drain regions 5, 6 and 7 are patterned by photolithography and RIE, thereby providing a pillar. The in-plane size of the pillar is, for example, approximately 15 nm×approximately 20 nm.

Figure 12:
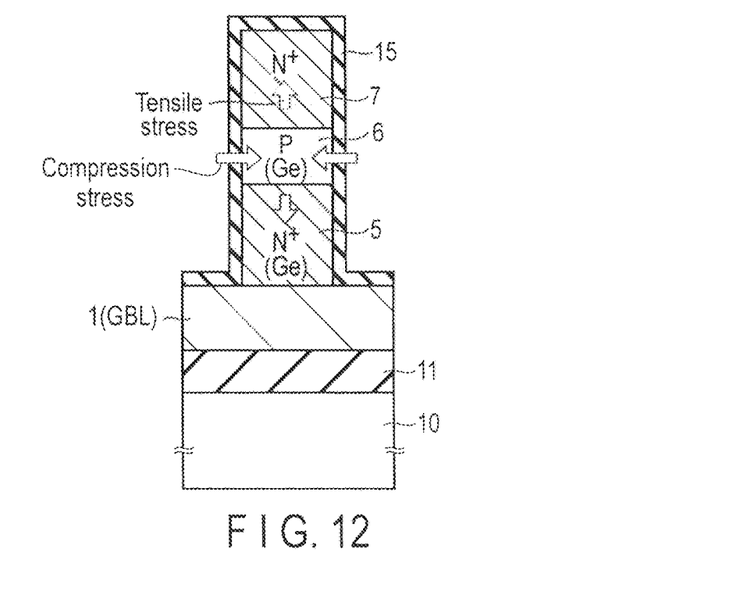

Thereafter, as shown in FIG. 12, a stress applying layer 15 is formed to cover the source, channel and drain regions 5, 6 and 7. The stress applying layer 15 is, for example, a silicon nitride layer. The stress applying layer 15 covers the side surfaces of the source, channel and drain regions 5, 6 and 7, which are positioned parallel to each other.

The resultant structure is subjected to annealing for applying strain effect to the channel region 6.

By the annealing process, parallel compression stress and vertical tensile stress occur in the channel region 6. As a result, the channel region 6 has parallel compression strain (along the channel width of the vertical-type FET) and vertical tensile strain (along the channel length of the vertical-type FET).

After the annealing, the stress applying layer 15 is removed by, for example, wet etching. However, even after the removal of the stress applying layer 15, the crystal strain is kept stored in the channel region 6.

As a result, the crystal orientation of the channel region 6 of a vertical-type FET in a vertical direction in which the channel current flows is secured, which enables enhancement of the on-current and reduction of variation therein.

Figure 13:
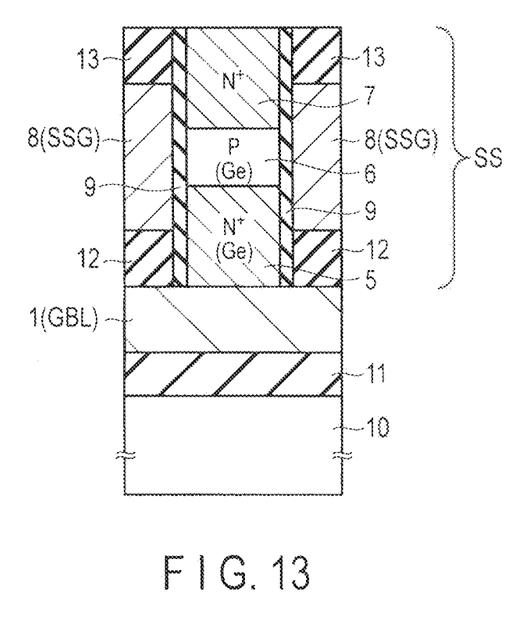

Further, as shown in FIG. 13, a gate insulating layer (for example, a silicon oxide layer) 9 is formed to cover the side surfaces of the pillar formed of the source, channel and drain regions 5, 6 and 7. Subsequently, a laminated structure of interlayer insulating layers 12 and 13 and a gate electrode (select gate line) 8 is formed. The thickness of the gate electrode 8 in the above-mentioned vertical direction is, for example, approximately 140 nm.

It is desirable that the upper surface of the interlayer insulating layer 13 should be substantially level with the upper surface of the drain region 7.

Figure 14:
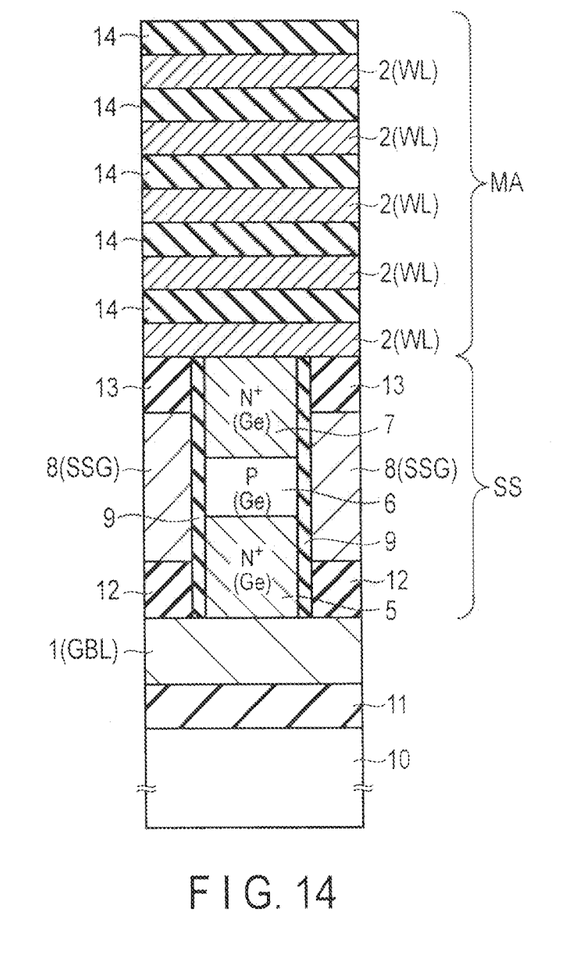

Thereafter, as shown in FIG. 14, a laminated structure of word lines 2 (WL) and interlayer insulating layers 14 is formed. Although in the embodiment, the number of the stacked word lines 2 is five, it is not limited to five.

Each word line 2 comprises TiN and has a thickness of, for example, approximately 10 nm in the above-mentioned vertical direction. Each interlayer insulating layer 14 comprises a silicon oxide layer and has a thickness of, for example, approximately 7 nm in the vertical direction. However, it is desirable that the uppermost interlayer insulating layer 14 should be thicker than the other interlayer insulating layers 14.

Figure 15:
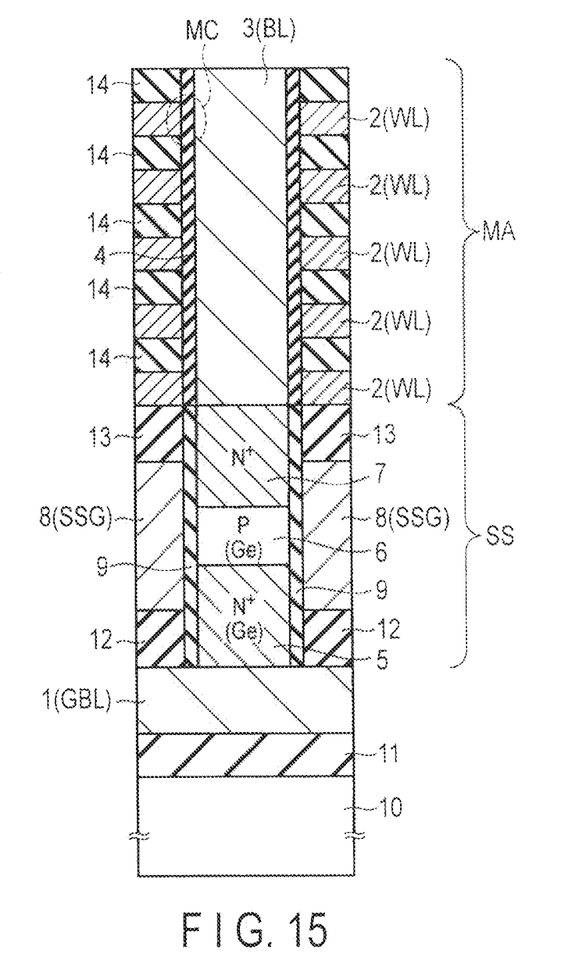

After that, as shown in FIG. 15, the word lines 2 (WL) and the interlayer insulating layers 14 are patterned by photolithography and RIE. As a result, a groove reaching the drain region 7 is formed. Further, resistance change layers 4 are formed on the inner surfaces of the groove to have a thickness of, for example, approximately 4 nm along the axis parallel to the surface of the substrate, so as not fill the groove.

Although in the embodiment, each resistance change layer 4 has a single-layer structure, it may have a multi-layer structure.

Lastly, a local bit line 3 (BL) is formed to completely fill the groove, whereby the memory cell array shown in FIG. 1 is completed.

After that, passivation is performed and wiring connections serving as input/output sections are formed, as in a general semiconductor device manufacturing process. Furthermore, so-called back-end process, such as detection or dicing, is performed.

CONCLUSION

As described above, the embodiment can provide a high-speed and large capacity resistance change memory.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A resistance change memory comprising:
   a substrate having a surface
   a first conductive line provided above the surface of the substrate;
   a second conductive line provided above the first conductive line, and extending in a first direction along the surface of the substrate;
   a third conductive line provided above the surface of the substrate and extending in a second direction, the second direction intersecting the first direction and the surface of the substrate;
   a select transistor provided between the first and third conductive lines; and
   a resistance change layer provided between the second and third conductive lines,
   wherein the select transistor includes:
   a first conductive layer provided on the first conductive line;
   a first semiconductor layer as a channel including crystal grains, the first semiconductor layer being provided on the first conductive layer;
   a second conductive layer provided on the first semiconductor layer, and connected to the third conductive line; and
   a fourth conductive line as a gate extending in the first direction, the fourth conductive line facing to the first semiconductor layer,
   wherein the first conductive layer and the first semiconductor layer include a predetermined impurity with a first impurity concentration and the second conductive layer includes no predetermined impurity or the predetermined impurity with a second impurity concentration less than the first impurity concentration, and
   wherein the crystal grains in the first semiconductor layer include first crystal grains and second crystal grains in a first plane extending in a direction along the surface of the substrate, a crystal orientation of the first crystal grains in the first plane is {001}-plane, a crystal orientation of the second crystal grains in the first plane is {101}-plane, and a number of the first crystal grains is larger than a number of the second crystal grains.

2. The memory of claim 1, wherein a number of crystal grains in which a crystal orientation in a parallel plane parallel to the first direction is {001}-plane, among the crystal grains in the first semiconductor layer, is larger than a number of crystal grains in which a crystal orientation in the parallel plane is {101}-plane.

3. The memory of claim 1, wherein the predetermined impurity is at least one of Ge, Ar, F, and C.

4. The memory of claim 1, wherein the first semiconductor layer has a compression stress in the first direction, and has a tensile stress in the second direction.

5. The memory of claim 1, wherein the first and second conductive layers are second and third semiconductor layers each including crystal grains respectively, the first semiconductor layer includes a first conductive type impurity, and the second and third semiconductor layers include a second conductive type impurity.

6. The memory of claim 1, further comprising a fifth conductive line stacked above the second conductive line, and extending in the first direction,
   wherein the resistance change layer is further provided between the third and fifth conductive lines.

7. The memory of claim 1, wherein a top end of the third conductive line is open.

8. The memory of claim 1, further comprising a controller configured to change a resistance of the resistance change layer between the second and third conductive lines by flowing a current between the second and third conductive lines.

* * * * *